United States Patent
Lee et al.

(10) Patent No.: US 6,171,942 B1
(45) Date of Patent: Jan. 9, 2001

(54) METHODS OF FORMING ELECTRICALLY CONDUCTIVE LINES IN INTEGRATED CIRCUIT MEMORIES USING SELF-ALIGNED SILICIDE BLOCKING LAYERS

(75) Inventors: Duck-Hyung Lee, Kyoungki-do; Jong-Woo Park, Seoul, both of (KR)

(73) Assignee: Samsung Electronics Co., Ltd. (KR)

( * ) Notice: Under 35 U.S.C. 154(b), the term of this patent shall be extended for 0 days.

(21) Appl. No.: 09/283,226

(22) Filed: Apr. 1, 1999

(30) Foreign Application Priority Data

Jun. 5, 1998 (KR) ................................................ 98-20804

(51) Int. Cl.[7] .................................................... H01L 21/70
(52) U.S. Cl. ........................... 438/596; 438/589; 438/592; 438/597; 257/296
(58) Field of Search .................................... 438/589, 592, 438/596, 597; 257/296

(56) References Cited

U.S. PATENT DOCUMENTS 5,589,423 * 12/1996 White et al. ......................... 437/228
6,015,748 * 1/2000 Kim et al. ............................. 438/592

* cited by examiner

*Primary Examiner*—Charles Bowers
*Assistant Examiner*—Lisa Kilday
(74) *Attorney, Agent, or Firm*—Myers Bigel Sibley & Sajovec

(57) ABSTRACT

Conductive lines are formed in integrated circuit memories using a Silicide blocking layer that is self-aligned. The Silicide blocking layer is self-aligned by etching an electrically insulating layer that is formed between a electrically conductive lines on a substrate in an integrated circuit memory. The etching removes the electrically insulating layer from the outer surfaces of the electrically conductive lines, but leaves a portion of the electrically insulating layer on the substrate between the electrically conductive lines. The portion of the electrically insulating layer remaining on the substrate may prevent the formation of a Silicide film on the substrate during a heating step used to form contacts on the outer surfaces of the electrically conductive lines. The self-aligned Silicide blocking layer may allow a reduction in the number of steps in the fabrication of the contacts and reduce the need to align a mask to the substrate to form the Silicide blocking layer.

14 Claims, 7 Drawing Sheets

METHODS OF FORMING ELECTRICALLY CONDUCTIVE LINES IN INTEGRATED CIRCUIT MEMORIES USING SELF-ALIGNED SILICIDE BLOCKING LAYERS

FIELD OF THE INVENTION

The present invention relates to the field of integrated circuits in general, and more particularly, to the formation of contacts in integrated circuits.

BACKGROUND OF THE INVENTION

As the level of integration of integrated circuits increases there may be a decrease in the size of conductive lines, such as contacts, formed in the integrated circuits. Decreasing the size of the contacts, however, may increase the contact resistance.

It is known to use a Self-Aligned Silicide (Salicide) process in integrated circuits having 0.35 um line width to decrease the resistance of contacts. Using a Salicide process may be problematic in some higher density integrated circuits, such as Dynamic Random Access Memories (DRAMs). For example, the Salicide process may adversely affect the capacitance of storage cells in a memory array of a DRAM.

In addition, forming low resistance contacts using a Silicide film may add steps to the photolithography process in which a Silicide Blocking Layer (SBL) is formed on portions of the integrated circuit. Also, additional margin may need to be added to the masks used in the photolithography steps to compensate for misalignment.

FIGS. 1–7 illustrate conventional methods of forming integrated circuit structures having Silicide contacts in two regions of the integrated circuit: a memory array A and a peripheral region B which includes areas outside the memory array A. Gate electrodes in the memory array region A may be formed with a closer spacing than the gate electrodes formed in the peripheral region B. According to FIG. 1, an integrated circuit substrate 10 is formed which includes Shallow Trench Isolation regions (STI) 12. The STI regions 12 may be formed using a field oxide layer. A plurality of gate electrodes 14 are formed on the integrated circuit substrate 10 with spacers 16 formed on sidewalls of the gate electrodes 14. Active source and drain regions may be formed in the substrate 10 between the plurality of gate electrodes 14 using high-density ion-implantation. The gate electrodes 14 may comprise polysilicon.

FIG. 2 illustrates the formation of an insulating layer 18 on the structure shown in FIG. 1. The insulating layer 18 may comprise an oxide layer which is formed on the entire substrate 10 as shown in FIG. 2. As shown in FIG. 3 an Anti-Reflective Layer (ARL) 20 is formed on the insulating layer 18. The ARL 20 may reduce the reflection of Ultra Violet light from the insulating layer 18 during a subsequent photolithography step.

As shown in FIG. 4, a photoresist film 22 is formed on the ARL 20 aligned to mask the underlying active regions of the integrated circuit substrate 10. The non-masked surfaces of the ARL 20 are exposed in a photolithography step. The formation of the photoresist film 22 may add steps to the fabrication process. In particular, additional fabrication steps may include mask alignment, mask formation and mask removal. These steps may add complexity and cost to the fabrication process.

As shown in FIG. 5, non-masked portions of the ARL 20 and the underlying insulating layer 18 of the structure shown in FIG. 4 are removed via etching to expose portions of the gate electrodes 14. The etching step forms a plurality of Silicide Blocking Layers 18a which include the portions of the insulating layer 18, spacers 16, and the ARL 20 (between the plurality of gate electrodes 14) which were underlying the photoresist film 22 in FIG. 4.

As shown in FIG. 6, the ARL 20 is removed with a wet-type cleaning process using an Hydrofluoric type etchant. Otherwise, a Silicide film applied during a subsequent step may not adhere properly to the ARL 20 which may cause failures in the integrated circuit.

As shown in FIG. 7, refractory metals, such as Co, Ti, and Ni, are used to form a Silicide film 24 on the gate electrodes 14 during a high temperature treatment. In particular, the materials that comprise the gate electrodes 14 react with the Silicide film 24 to form a low resistance metal contact. In the regions where the SBL 18a was not removed, the high temperature treatment forms non-reactive metals which are then removed from the integrated circuit.

If the photoresist film 22 is misaligned, the Silicide film 24 may form only partially on the plurality of gate electrodes 14 or may form on the active regions (such as the active source and drain regions in the integrated circuit substrate 10). Moreover, as the integration level of the integrated circuits increases, the misalignment may worsen.

In view of the above, there continues to exist a need to further improve the fabrication of integrated circuits having contacts formed therein using Salicide processes.

SUMMARY OF THE INVENTION

It is, therefore, an object of the present invention to allow improvements in the fabrication of conductive lines in integrated circuit memories.

It is a further object of the present invention to allow a reduction in the number of steps to fabricate conductive lines in integrated circuit memories.

These and other objects of the present invention are provided by forming a patterned blocking layer on a substrate between a plurality of conductive lines which expose the outer surface of the conductive lines without using photolithography to form the patterned blocking layer. In particular, an electrically insulating layer is formed on a plurality of electrically conductive lines and on the substrate between the plurality of electrically conductive lines. The portion of the electrically insulating layer located on the substrate between the plurality of electrically conductive lines is etched to form the self-aligned blocking layer. A Silicide film is formed on the plurality of electrically conductive lines, but not on the self-aligned blocking layer.

According to the present invention, a mask is not used to remove the electrically insulating layer to form the blocking layer. In conventional processes, a mask may be used to create a blocking layer which may add the steps of mask alignment, mask formation on the substrate, and mask removal from the substrate to the fabrication process. Also, because the self-aligned blocking layer of the present invention is formed without a photolithographic step, an anti-reflective layer may not be needed. Moreover, conventional processes may add margin to the mask alignment step to allow for mask misalignment which may complicate the fabrication process.

In a further aspect of the invention, an etch stopping layer is formed on the plurality of conductive lines and under the electrically insulating layer. In particular, the electrically insulating layer is removed until the etch stopping layer is exposed. Subsequently, the etch stopping layer is removed from the outer surfaces of the plurality of conductive lines.

In a further aspect of the present invention, an electrically insulating layer is formed on the first and second electrically conductive lines and on a portion of the substrate between the first and second electrically conductive lines. A portion of the electrically insulating layer is removed from the substrate between the first and second electrically conductive lines, wherein a residue of the electrically insulating layer remains in contact with the substrate and is self-aligned with the first and second electrically conductive lines. First and second Silicide contacts are formed on the first and second electrically conductive lines, wherein the first and second Silicide contacts are self-aligned to the residue on the electrically insulating layer.

DETAILED DESCRIPTION OF THE PREFERRED EMBODIMENTS OF THE INVENTION

Figure 1:
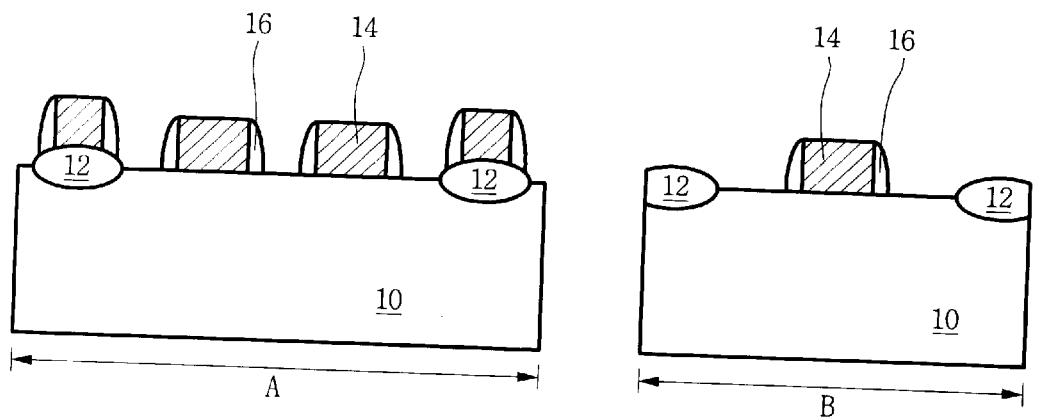
FIGS. 1–7 are enlarged cross-sectional views of structures which illustrate conventional methods of forming contacts in integrated circuits.
Figure 2:
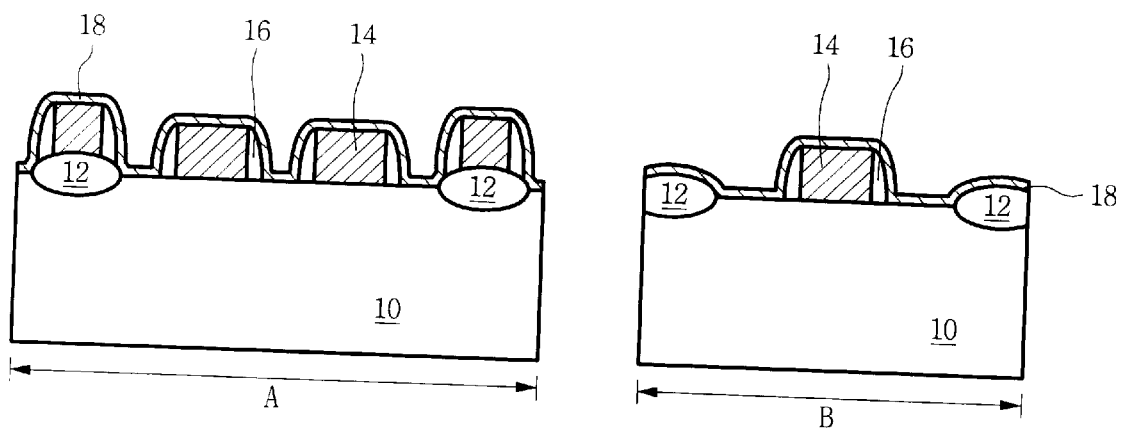
Figure 3:
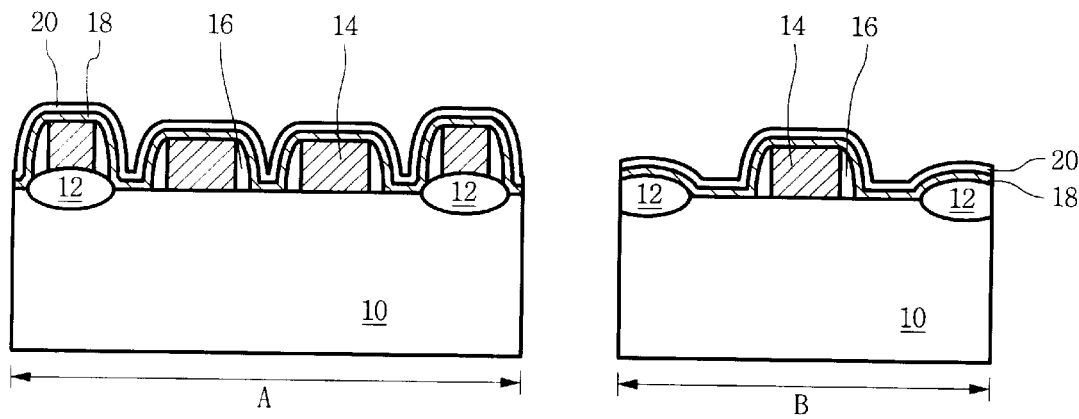
Figure 4:
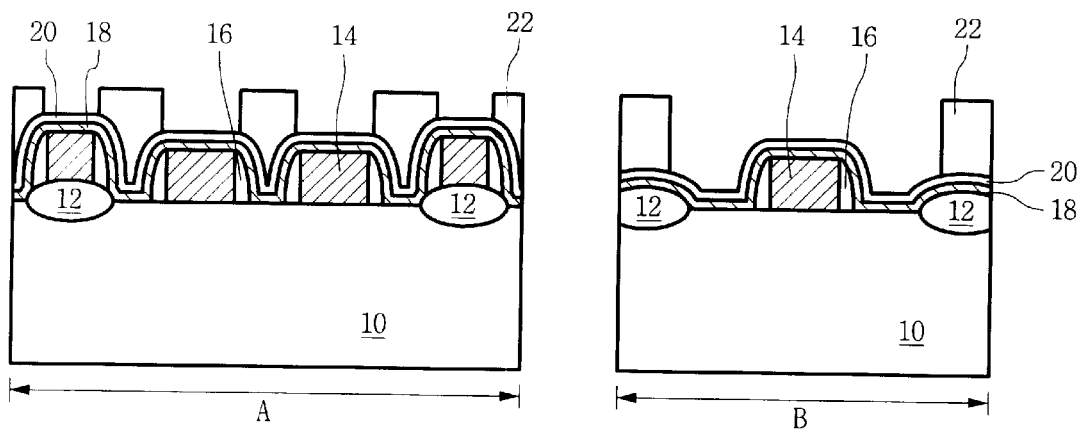
Figure 5:
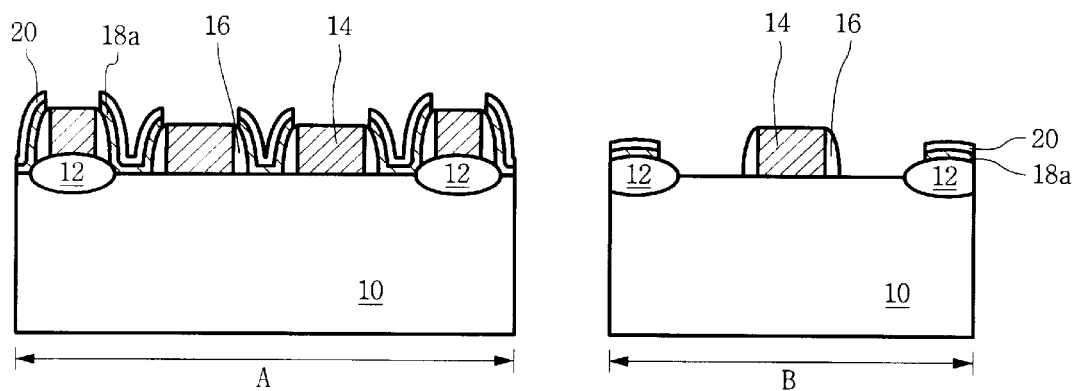
Figure 6:
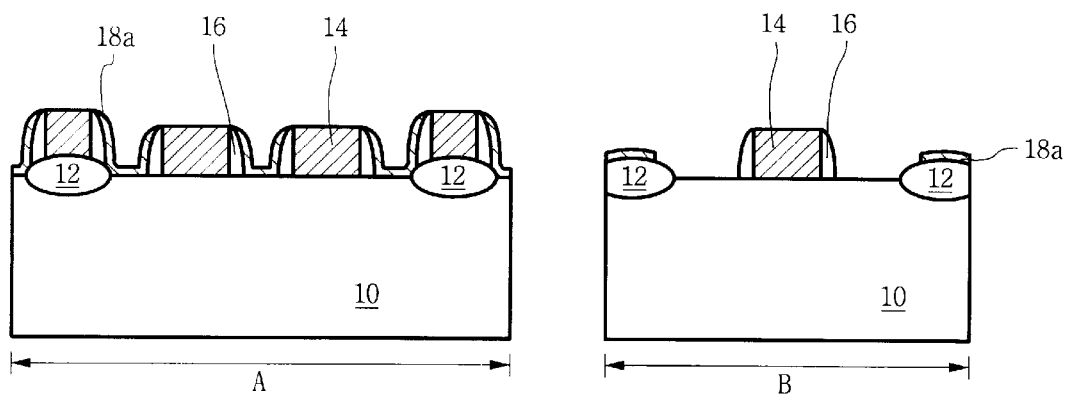
Figure 7:
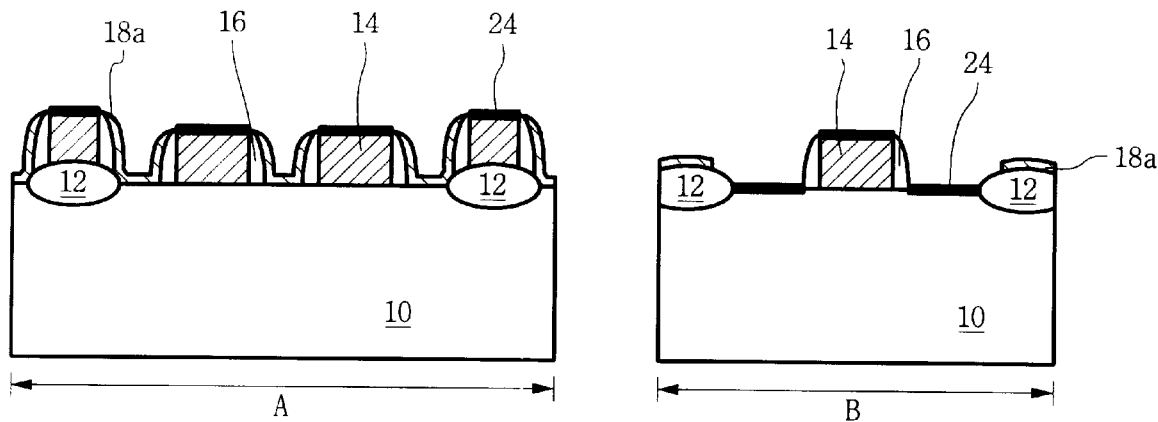

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will be understood that when part of an element, such as surface of a conductive line, is referred to as "outer," it is closer to the outside of the integrated circuit than other parts of the element. Like numbers refer to like elements throughout.

FIGS. 8–13 are enlarged cross-sectional views of structures that illustrate methods of forming conductive lines in integrated circuit memories including Silicide films in two regions of the integrated circuit: a memory array region A and a peripheral region B according to the present invention. Gate electrodes in the memory array region A may be formed with a closer spacing than the gate lines formed in the peripheral region B. Some of the plurality of gate electrodes formed in the memory array region A, may be formed at a wider spacing to allow the formation of bit line contacts in the memory array region A.

Figure 8:
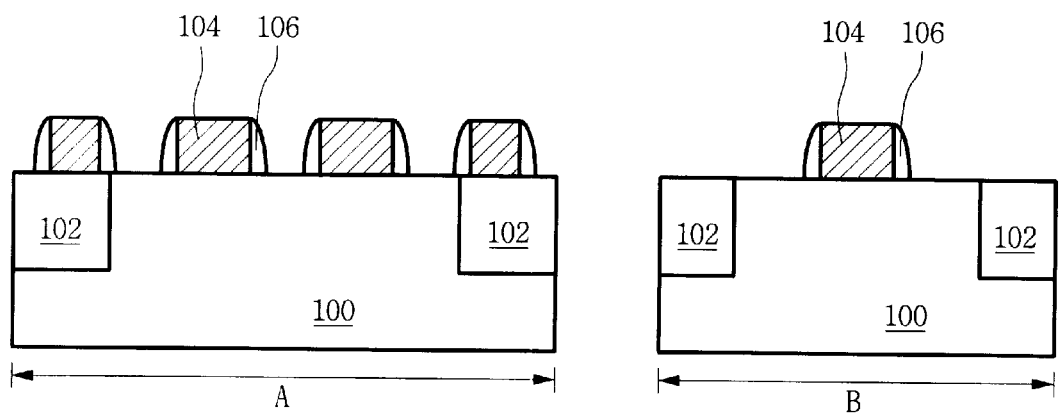
FIGS. 8–13 are enlarged cross-sectional views of structures that illustrate methods of forming conductive lines in integrated circuit memories according to the present invention.

As shown in FIG. 8, an integrated circuit substrate 100 is formed including Shallow Trench Isolation (STI) regions 102. Other conventional forms of isolation also may be used. A plurality of gate electrodes 104 are formed on the integrated circuit substrate 100 with spacers 106 formed on either side of each of the plurality of gate electrodes 104. The gate electrodes 104 may comprise polysilicon. The spacers 106 may include multiple layers.

Figure 9:
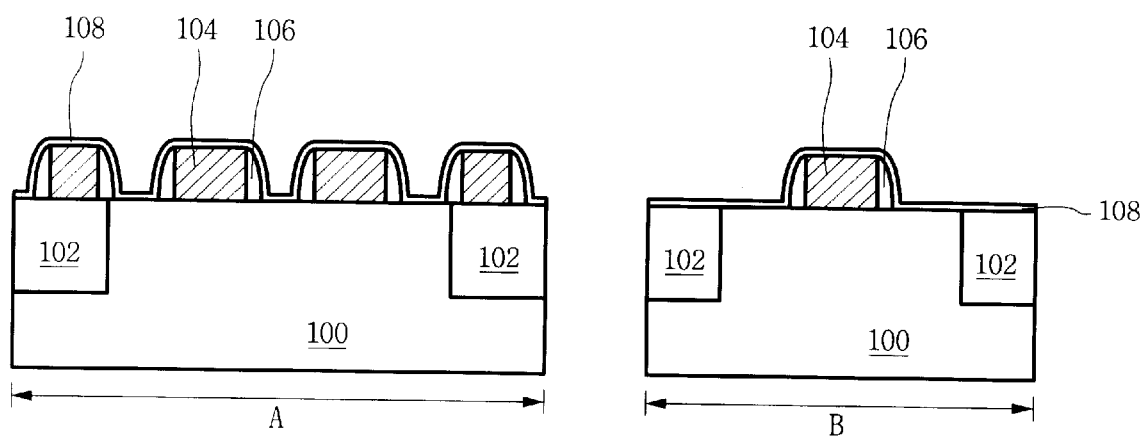

As shown in FIG. 9, an etch stopping layer 108 is formed on each of the plurality of gate electrodes 104, on the spacers 106, and on the integrated circuit substrate 100. The etch stopping layer may comprise a nitride film or an undoped polysilicon material formed to a thickness in a range between about 20 Å to 200 Å.

Figure 10:
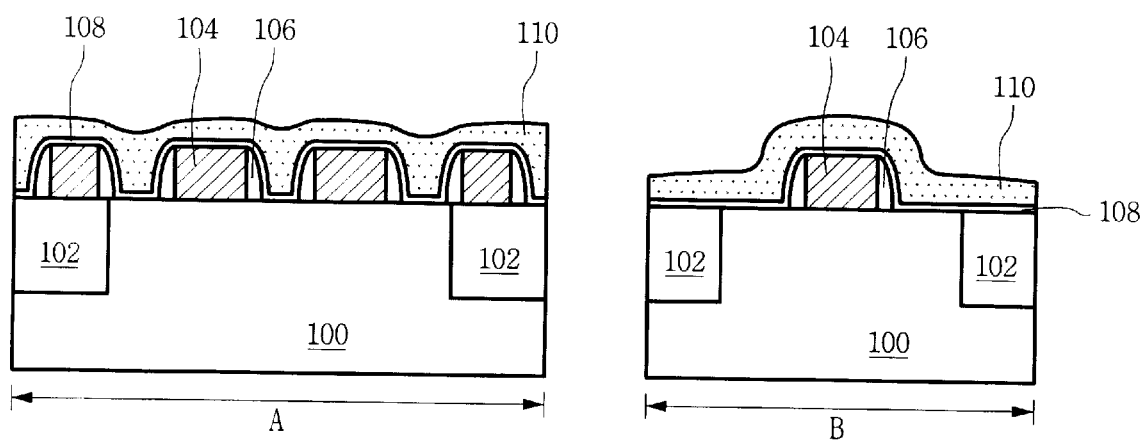
Figure 11:
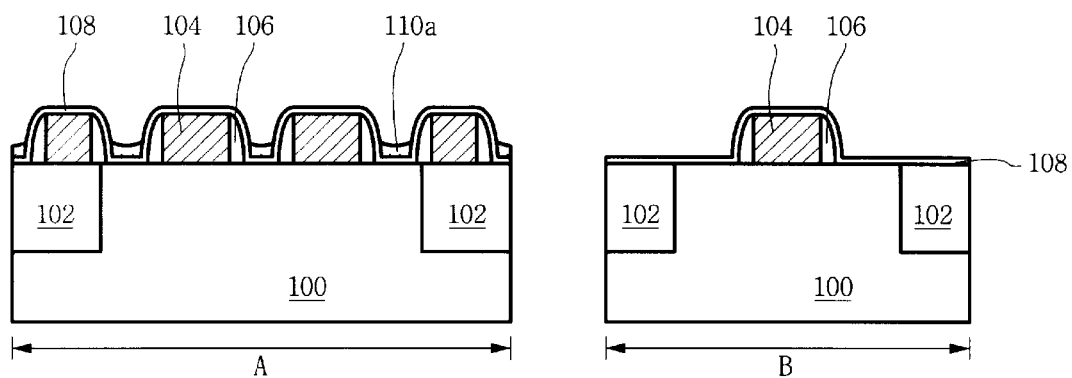

As shown in FIG. 10, an electrically insulating layer 110 is formed on the etch stopping layer 108. The electrically insulating layer 110 may comprise Undoped Silicate Glass (USG), an oxide film applied via Chemical Vapor Deposition (CVD) or a layer that includes both USG and an oxide film. As shown in FIG. 11, the electrically insulating layer 110 is etched (with a wet etch process) until the etch stopping layer 108 is exposed. A portion of the electrically insulating layer 110a located on the active regions between the plurality of gate electrodes 104 is not completely removed by the etching step, thereby forming a Silicide Blocking Layer (SBL) between the plurality of gate electrodes 104 on the active regions in the integrated circuit substrate 100. In particular, a residue of the electrically insulating layer remains on the integrated circuit substrate 100 between the plurality of gate electrodes 104. The wet etching step may be performed using an etchant selected from the group of chemicals including Hydrofluoric acid (HF).

The SBL 110a formed between the plurality of gate electrodes 104 on the active regions in the integrated circuit substrate 100 is self aligned and, as such, may avoid the alignment problems associated with conventional processes. In particular, photolithography need not be used to define the SBL 110a. Rather, the properties of the wet etching may be used to remove the insulating layer 110 while allowing a residue of the insulating layer 110 to remain on the integrated circuit substrate 100 between the plurality of gate electrodes 104. Because the active regions in the peripheral region B are wider than the active regions in the memory array region A, the insulating layer 110 may be completely removed by the wet etch step described above.

Figure 12:
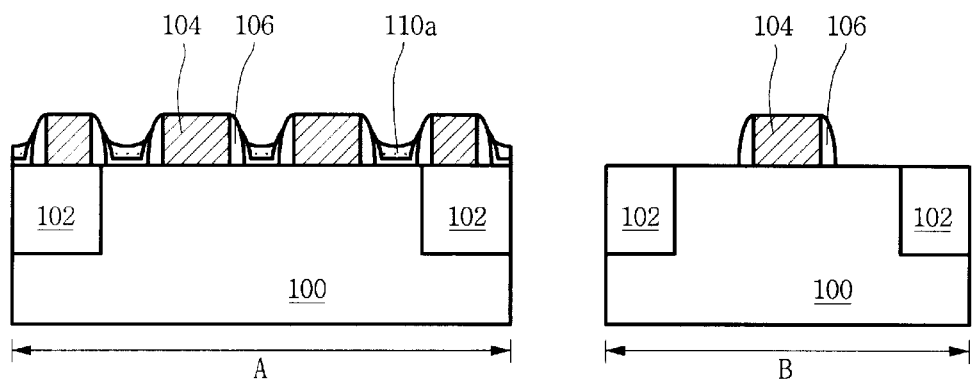

As shown in FIG. 12, the etch stopping layer 108 is removed from the surfaces of the gate electrodes 104. The etch stopping layer 108 may be removed from the surfaces of the gate electrodes 104 by a dry etch process or by a photo etching process in the memory array region A. A residue of the etch stopping layer 108 also remains under the insulating layer 110 in the memory array region A. If a photo etching process is used, a photoresist film is formed on the residue of the electrically insulating layer 110 which remains on the substrate 100 between the plurality of gate electrodes 104 and subsequently removed. The etch stopping layer 108 remains, however, under the residue of the electrically insulating layer 110 between the plurality of gate electrodes which was not removed by the wet etch. However, the etch stopping layer 108 is removed from surfaces at the gate electrodes 104 located in the peripheral region B.

Figure 13:
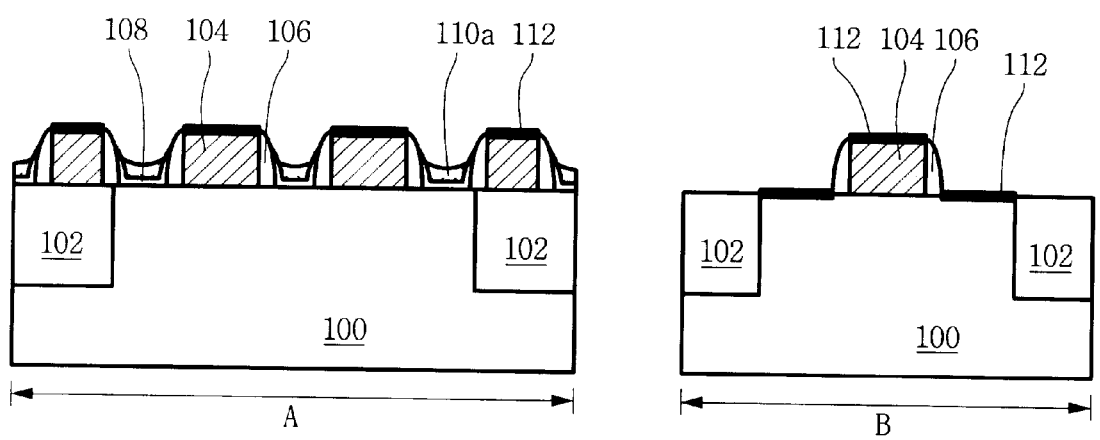

As shown in FIG. 13, refractory metals are applied to the surfaces of the plurality of gate electrodes 104, the spacers 106, and the SBL 110a. The refractory metals may comprise Co, Ti, or Ni. The structure shown in FIG. 13 is heated which causes the refractory metals to react with the gate electrode 104 which forms a Silicide film 112 having a low resistance. The SBL 110a, however, does not react with the refractory metals, thereby avoiding the formation of a Silicide film 112 on the portions of the integrated circuit that include the SBL 110a. The process is completed by a cleaning step using, for example, sulfuric acid.

To prevent the formation of the Silicide film 112 in the peripheral region B, a photo etching step may be used to protect the etch stopping layer 108 formed on the active regions of the peripheral region B.

In an alternative method, the SBL 110a is formed by etching the electrically insulating layer 110 as described above, but the etch stopping layer 108 is not used to stop the etching. Instead, the electrically insulating layer 110 is removed until the gate electrode 104 is exposed. A portion of the electrically insulating layer 110 will remain on the active regions between the plurality of gate electrodes 104. Consequently, the formation of the etch stopping layer 108 and the removal of the etch stopping layer may be avoided, thereby eliminating these steps from the process described above.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming electrically conductive lines in an integrated circuit comprising the steps of:
    forming a plurality of electrically conductive lines on an integrated circuit substrate, the electrically conductive lines including an outer surface;
    forming a patterned blocking layer on the substrate between the plurality of conductive lines that is self-aligned thereto, that exposes the outer surface of the conductive lines, without using photolithography to form the patterned blocking layer; and
    forming a silicide film on the outer surfaces of the plurality of electrically conductive lines, wherein the blocking layer prevents formation of the silicide film on the substrate between the plurality of electrically conductive lines.

2. The method of claim 1, wherein the step of forming a blocking layer comprises the step of removing the electrically insulating layer from the outer surfaces of the plurality of electrically conductive lines and a portion of the electrically insulating layer from the sidewall surface of the plurality of electrically conductive lines.

3. The method of claim 1, wherein the steps of forming a silicide film comprises the step of applying a refractory metal to the electrically conductive lines which reacts to form the silicide film on the electrically conductive lines and to the substrate between the plurality of electrically conductive lines which forms a non-reactive metal on the substrate between the plurality of electrically conductive lines; and
    removing the non-reactive metal from the substrate between the plurality of electrically conductive lines.

4. The method of claim 3, wherein the steps of applying comprise the steps of applying a metal selected from a group consisting of Co, Ti, and Ni.

5. The method of claim 1, wherein the step of forming the electrically insulating layer comprises the step of forming an electrically insulating layer using undoped silicate glass or an oxide film.

6. A method of forming electrically conductive lines in an integrated circuit comprising the steps of:
    forming first and second electrically conductive lines on a substrate in the integrated circuit;
    forming first and second insulating sidewall spacers on the first and second electrically conductive lines respectively;
    forming an electrically insulating layer on the first and second electrically conductive lines and on the substrate between the first and second electrically conductive lines;
    removing a portion of the electrically insulating layer from the substrate between the first and second electrically conductive lines, without using photolithography wherein a residue of the electrically insulating layer remains on the substrate between the first and second conductive lines and is self-aligned thereto; and
    forming first and second Silicide contacts, which are self-aligned to the residue of the electrically insulating layer, on the first and second electrically conductive lines.

7. The method of claim 6, wherein the step of forming the first and second silicide contacts comprises the steps of:
    applying a refractory metal to the first and second electrically conductive lines to form the first and second Silicide contacts and to the electrically insulating layer on the substrate between the first and second electrically conductive lines to form a non-reactive metal on the substrate between the first and second electrically conductive lines; and
    removing the non-reactive metal from the substrate between the first and second electrically conductive lines.

8. The method of claim 7, wherein the steps of applying comprise the steps of applying a metal selected from a group consisting of Co, Ti, and Ni.

9. The method of claim 6, wherein the step of forming the electrically insulating layer comprises the step of forming an electrically insulating layer using undoped silicate glass or an oxide film.

10. A method of forming electrically conductive lines in an integrated circuit comprising the steps of:
    forming a plurality of spaced apart, electrically conductive lines on a substrate in the integrated circuit, the electrically conductive lines including an outer surface and a sidewall surface;
    forming a plurality of active regions in the substrate between the plurality of electrically conductive lines;
    forming an etch stopping layer on the outer surfaces of the plurality of electrically conductive lines and on the sidewalls of the plurality of electrically conductive lines;
    forming an electrically insulating layer on the etch stopping layer;
    removing the electrically insulating layer from the outer surfaces of the plurality of electrically conductive lines to expose the etch stopping layer and leaving a portion of the electrically insulating layer with using photolithography on the substrate between the plurality of electrically conductive lines so that the electrically insulating layer is self-aligned with the active regions in the substrate to provide a blocking layer;
    removing the etch stopping layer from the outer surfaces of the plurality of electrically conductive lines to expose the outer surfaces of the plurality of electrically conductive lines; and
    forming a silicide film on the exposed outer surfaces of the plurality of electrically conductive lines, wherein the blocking layer prevents the formation of the silicide film on the substrate between the plurality of electrically conductive lines.

11. The method of claim 10, wherein the step of removing the electrically insulating layer comprises the step of:

removing the electrically insulating layer from the surface of the plurality of electrically conductive lines to expose the electrically conductive lines; and remove a portion of the electrically insulating layer from the substrate between the plurality of electrically conductive lines.

12. The method of claim 10, wherein the steps of forming a silicide film comprises the steps of:

applying a refractory metal to the exposed outer surfaces of the electrically conductive lines to form the silicide film on the exposed electrically conductive lines;

applying the refractory metal to the electrically insulating layer on the substrate between the plurality of electrically conductive lines to form a non-reactive metals on the substrate between the plurality of electrically conductive lines; and removing the non-reactive metals from the substrate between the plurality of electrically conductive lines.

13. The method of claim 12, wherein the steps of applying comprise the steps of applying a metal selected from a group consisting of Co, Ti, and Ni.

14. The method of claim 6, wherein the step of forming the electrically insulating layer comprises the step of forming an electrically insulating layer using undoped silicate glass or an oxide film.

* * * * *

UNITED STATES PATENT AND TRADEMARK OFFICE
CERTIFICATE OF CORRECTION

PATENT NO. : US 6,171,942 B1
DATED : January 9, 2001
INVENTOR(S) : Duck-Hyung Lee et al.

It is certified that error appears in the above-identified patent and that said Letters Patent is hereby corrected as shown below:

Column 6, line 11, delete "Silicide" and substitute – silicide –.
Column 6, line 10, delete "Silicide" and substitute – silicide –.
Column 7, line 4, delete "remove" and substitute – removing –.
Column 8, line 9, delete "6" and substitute – 11 –.

Signed and Sealed this

Twenty-ninth Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO. : 6,171,942 B1 Page 1 of 1
APPLICATION NO. : 09/283226
DATED : January 9, 2001
INVENTOR(S) : Lee et al.

It is certified that error appears in the above-identified patent and that said Letters Patent is hereby corrected as shown below:

Column 6, Claim 10, Line 52:
Please correct "of the electrically insulating layer with using"
To read -- of the electrically insulating layer without using --

Signed and Sealed this

Twenty-seventh Day of May, 2008

JON W. DUDAS
*Director of the United States Patent and Trademark Office*